(12) United States Patent
Hsu et al.

(10) Patent No.: US 8,322,020 B2
(45) Date of Patent: Dec. 4, 2012

(54) METHOD FOR FABRICATING A SEMICONDUCTOR TEST PROBE CARD SPACE TRANSFORMER

(75) Inventors: Ming Cheng Hsu, Hsin-Chu (TW); Clinton Chih-Chieh Chao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/227,580

(22) Filed: Sep. 8, 2011

(65) Prior Publication Data

US 2012/0017428 A1    Jan. 26, 2012

Related U.S. Application Data

(62) Division of application No. 12/165,970, filed on Jul. 1, 2008, now Pat. No. 8,033,012.

(60) Provisional application No. 61/034,831, filed on Mar. 7, 2008.

(51) Int. Cl.
    *H01F 7/06* (2006.01)
(52) U.S. Cl. ........ 29/602.1; 29/593; 29/603.09; 29/850; 29/853; 29/854
(58) Field of Classification Search ............ 29/874, 29/593, 603.09, 840, 882, 884, 825, 832, 29/853, 602.1, 850; 324/754, 761, 758, 762, 324/158.1; 438/597, 14; 333/33, 246, 247
See application file for complete search history.

(56) References Cited

U.S. PATENT DOCUMENTS

| 5,806,181 | A   |   | 9/1998 | Khandros et al. |
| 6,064,213 | A   |   | 5/2000 | Khandros et al. |
| 6,242,929 | B1  |   | 6/2001 | Mizuta |
| 6,410,990 | B2  |   | 6/2002 | Taylor et al. |
| 6,686,754 | B2  | * | 2/2004 | Miller ............... 324/754.18 |
| 6,791,171 | B2  | * | 9/2004 | Mok et al. ............ 257/678 |
| 6,791,347 | B2  |   | 9/2004 | Ishizaka et al. |
| 6,917,210 | B2  |   | 7/2005 | Miller |
| 2005/0101037 | A1 |  | 5/2005 | Farnworth et al. |
| 2006/0022688 | A1 |  | 2/2006 | Giga et al. |

* cited by examiner

*Primary Examiner* — Derris Banks
*Assistant Examiner* — Tai Nguyen
(74) *Attorney, Agent, or Firm* — Duane Morris LLP

(57) ABSTRACT

A space transformer for a semiconductor test probe card and method of fabrication. The method may include depositing a first metal layer as a ground plane on a space transformer substrate having a plurality of first contact test pads defining a first pitch spacing, depositing a first dielectric layer on the ground plane, forming a plurality of second test contacts defining a second pitch spacing different than the first pitch spacing, and forming a plurality of redistribution leads on the first dielectric layer to electrically couple the first contact test pads to the second contact test pads. In some embodiments, the redistribution leads may be built directly on the space transformer substrate. The method may be used in one embodiment to remanufacture an existing space transformer to produce fine pitch test pads having a pitch spacing smaller than the original test pads.

18 Claims, 9 Drawing Sheets

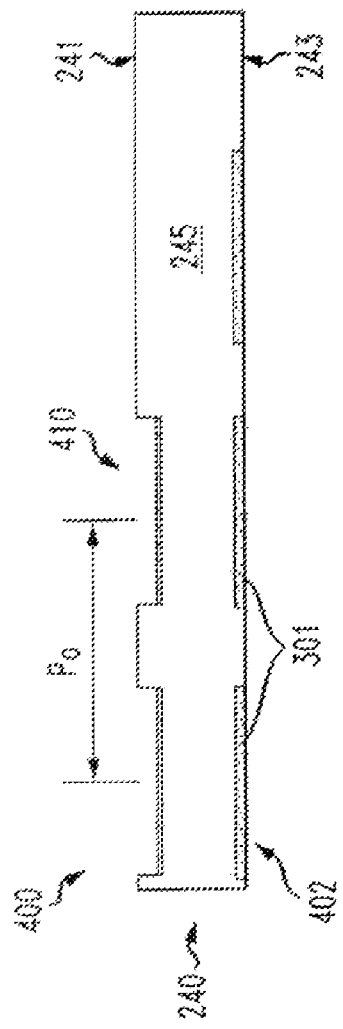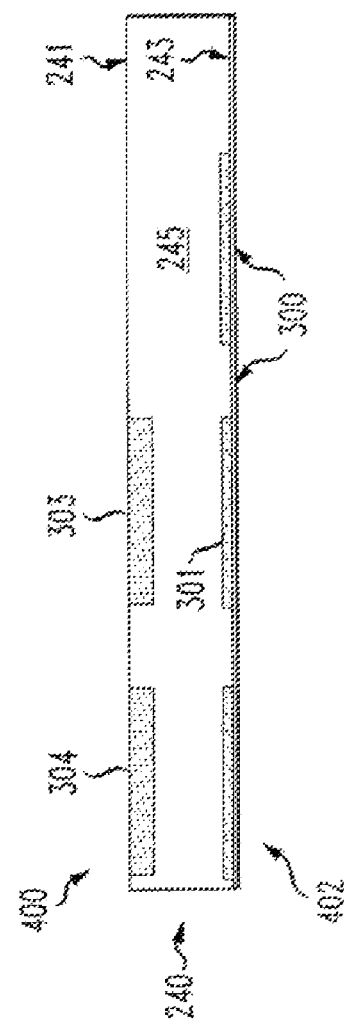

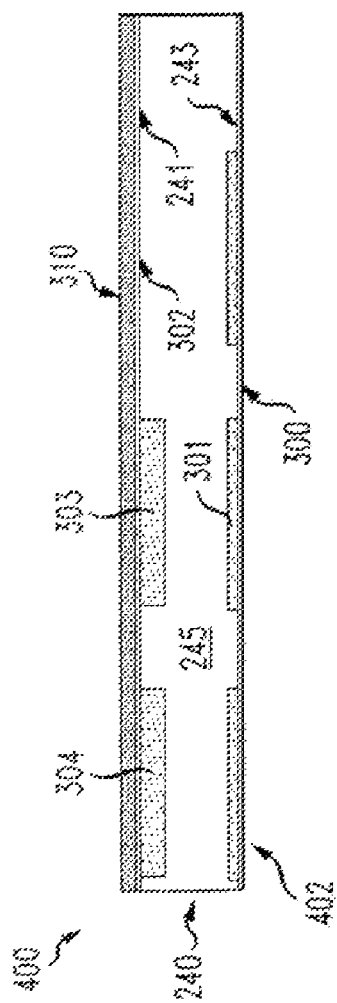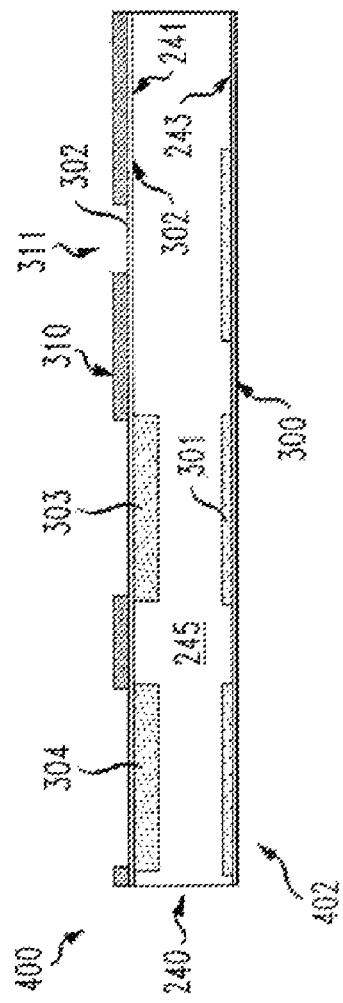

METHOD FOR FABRICATING A SEMICONDUCTOR TEST PROBE CARD SPACE TRANSFORMER

CROSS-REFERENCE TO RELATED APPLICATIONS

This application is a divisional application of U.S. application Ser. No. 12/165,970 filed Jul. 1, 2008, which claims the benefit of U.S. provisional patent application Ser. No. 61/034,831 filed on Mar. 7, 2008, the contents of each of which are incorporated herein by reference in their entirety.

FIELD OF THE INVENTION

The present invention generally relates to semiconductors, and more particularly to probes cards for testing integrated circuits formed on a semiconductor wafer.

BACKGROUND

Modern semiconductor fabrication involves numerous steps including photolithography, material deposition, and etching to form a plurality of individual semiconductor devices or integrated circuit chips (dice) on a single semiconductor silicon wafer. Typical semiconductor wafers produced today may be at least about 6 inches or more in diameter, with a 12 inch diameter wafer being one common size. Some of the individual chips formed on the wafer, however, may have defects due to variances and problems that may arise during the intricate semiconductor fabrication process. Prior to wafer dicing wherein the individual integrated circuit chips (dies) are separated from the semiconductor wafer, electrical performance and reliability tests are performed on a plurality of chips simultaneously by energizing them for a predetermined period of time (i.e., wafer level burn-in testing). These tests may typically include LVS (layout versus schematic) verification, IDDq testing, etc. The resulting electrical signals generated from each chip or DUT (device under test) are captured and analyzed by automatic test equipment (ATE) having test circuitry to determine if a chip has a defect.

To facilitate wafer level burn-in testing and electrical signal capture from numerous chips on the wafer at the same time, DUT boards or probe cards as they are commonly known in the art are used. Probe cards are essentially printed circuit boards (PCBs) that contain a plurality of metallic electrical probes that mate with a plurality of corresponding electrical contacts or terminal formed on the wafer for the semiconductor chips. Each chip or die has a plurality of contacts or terminals itself which must each be accessed for testing. A typical wafer level test will therefore require that electrical connection be made between well over 1,000 chip contacts or terminals and the ATE test circuitry. Accordingly, precisely aligning the multitude of probe card contacts with chip contacts on the wafer and forming sound electrical connections is important for conducting accurate wafer level testing. Probe cards are typically mounted in the ATE and serve as an interface between the chips or DUTs and the test head of the ATE.

As semiconductor fabrication technology advances continue to be implemented, the spacing between electrical test contact pads (i.e. "pitch") of dies or chips on the semiconductor wafer continues to shrink. As shown in FIG. 1, illustrating one exemplary next generation semiconductor die or DUT configuration as may be found on a wafer, testing pad pitches of 50 microns or less are desirable. The DUT testing pad pitch may be larger than the pitch between TSV (through silicon via) pads on the DUT, which may be for example 17 microns in some possible embodiments. However, a technology bottleneck occurs with existing known testing probe card designs that do not support such small testing pad pitches.

Known probe cards include a multi-layer interconnect substrate or space transformers disposed between the testing printed circuit board (PCB) and probes (such as fingers, needles, etc.) that engage the testing pads on the DUTs. The space transformers convey electrical test and power signals between the PCB and probes. Space transformers typically have a ball grid array (BGA) interconnect system on one side that mates with contacts on the testing PCB and a C4 (controlled collapse chip connection) interconnect system that mates with the upper portions of the testing probes. However, the minimum C4 pad pitch of these known space transformers is typically about 150 microns, making them incompatible with the desired 50 micron or less C4 pad pitch spacing needed to support the finer pitch probe spacing.

Accordingly, an improved testing probe card space transformer with finer C4 pad pitches is desired.

SUMMARY

A method for fabricating and modifying a semiconductor test probe card space transformer to decrease pitch spacing of a contact test pad is provided. In one embodiment, the method includes: providing a space transformer having a substrate and plurality of first contact test pads on one side for performing DUT electrical tests, the first test pads defining a first pitch spacing between the test pads; depositing a ground plane on the first metal layer; depositing a first passivation layer on the ground plane; forming a plurality of second test contacts, the second contacts defining a second pitch spacing between the contacts being different than the first pitch spacing; and forming a plurality of redistribution leads on the first passivation layer to electrically couple the first contact test pads to the second contact test pads. In one embodiment, the first contact test pads are embedded or encapsulated within a second passivation layer.

In another embodiment, a method for fabricating a semiconductor test probe card space transformer includes: providing a space transformer having a substrate and plurality of first contact test pads on one side for performing DUT electrical tests, the first test pads defining a first pitch spacing between the test pads; forming a plurality of second test contacts on the substrate, the second contacts defining a second pitch spacing between the contacts being different than the first pitch spacing; and forming a plurality of redistribution leads to electrically couple the first contact test pads to the second contact test pads. In one embodiment, the method further includes encapsulating the first and second contact test pads with a passivation layer. Preferably, the method includes forming conductive shafts through the passivation layer to extend the second contact test pads to an exposed surface of the passivation layer for making electrical contact with test card probes for wafer level testing of integrated circuit chips.

According to another aspect of the invention, a remanufactured semiconductor test probe card space transformer with fine pitch contact pad includes: a substrate having a first side and a second side; a plurality of first test contacts embedded in the substrate between the first and second sides; and a plurality of second test contacts disposed on the first side. In a preferred embodiment, the second test contacts having a pitch spacing smaller than the first test contacts. In another embodiment, the space transformer includes a plurality of redistribution leads electrically connecting at least some of the second test contacts with the embedded first test contacts.

In yet another embodiment, the substrate includes a passivation layer covering the first test contacts.

BRIEF DESCRIPTION OF THE DRAWINGS

The features of the preferred embodiments will be described with reference to the following drawings where like elements are labeled similarly, and in which:

FIGS. 3-14 show exemplary method steps in the form of sequential partial cross-sectional side views for fabricating the space transformer of the test probe card of FIG. 2;

Figure 1:
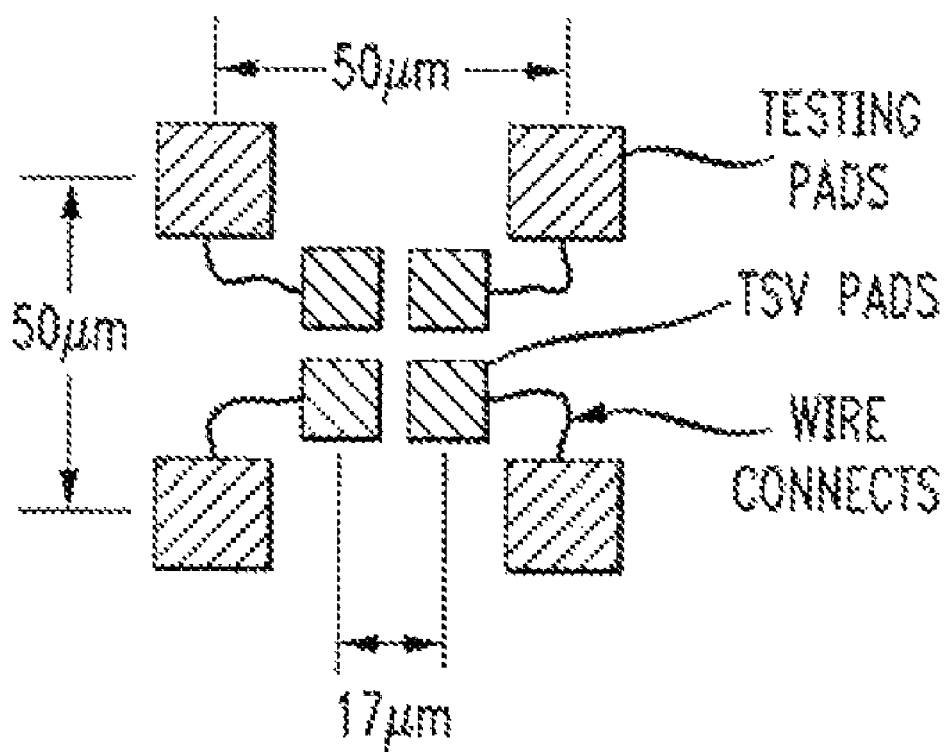
FIG. 1 is a top layout view of an exemplary semiconductor DUT showing next generation electrical testing pad configurations and spacings.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

As the term may be used herein in describing metallic test probes and tips or needles, rigid shall have its customary meaning of a structure that is generally deficient in or devoid of flexibility.

Figure 2:
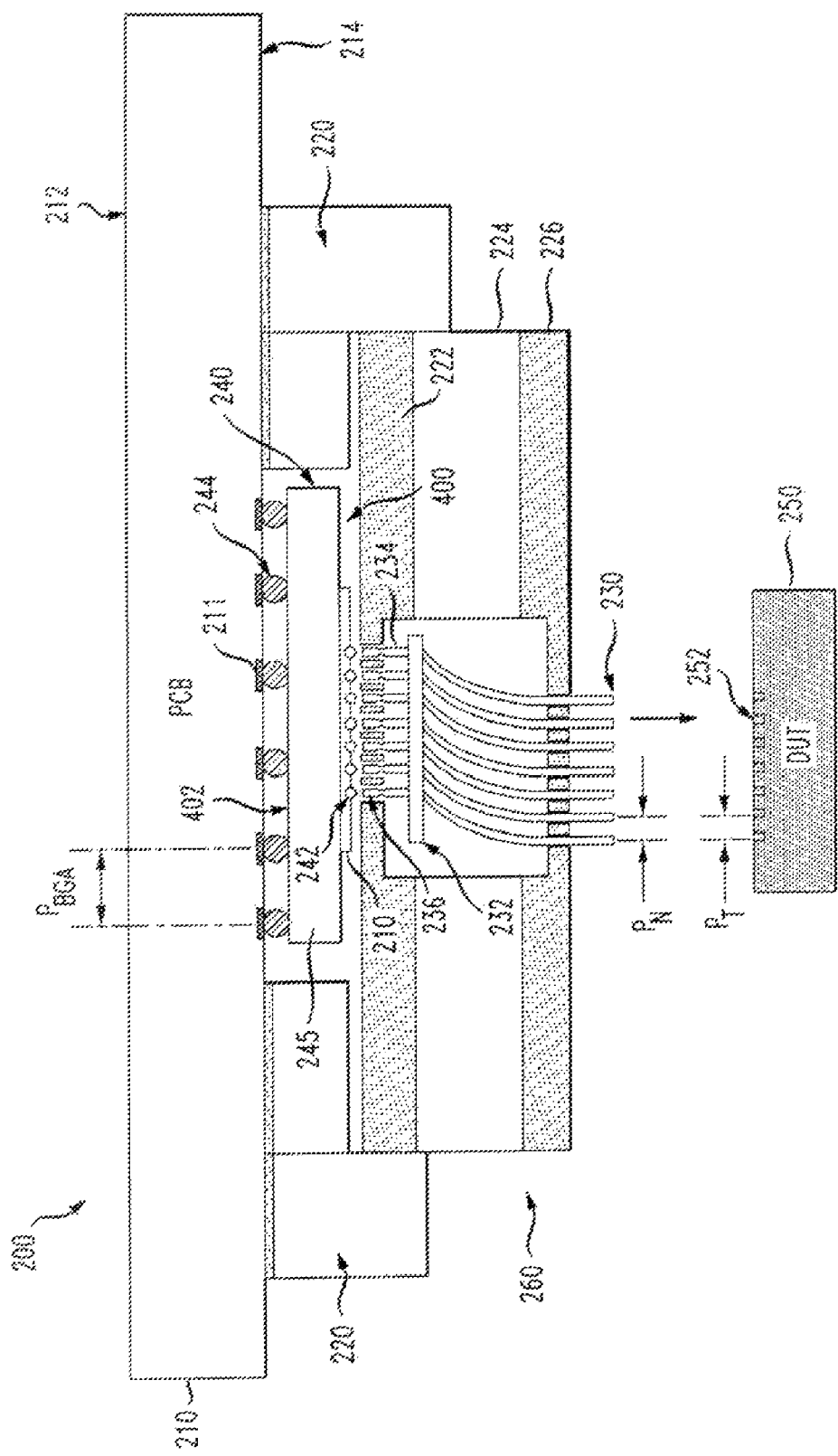
FIG. 2 is a cross-sectional side view of a test probe card having a space transformer according to principles of the present invention.

FIG. 2 shows one exemplary embodiment of a commercially-available testing probe card 200 modified according to principles of the present invention to include a space transformer 240 with a fine pitch C4 contact pad array. Probe card 200 may be any suitable commercially-available probe card, such as without limitation a Cobra® card available from Wentworth Laboratories, Inc. of Brookfield, Conn. having probe needles or a probe card available from FormFactor® of Livermore, Calif. having MicroSpring® needles. Preferably, the probe card selected should be capable of a test probe needle spacing or pitch of about 50 microns or less to mate with testing pads on a DUT having the same pitch or spacing (see, e.g. FIG. 1).

Referring to FIG. 2, probe card 200 includes a testing PCB 210 having a top surface 212 and a bottom surface 214, a mounting ring 220 attached thereto, a testing probe head 260 supported by the mounting ring, and a space transformer 240. In one embodiment, probe head 260 includes a plurality of commercially-available testing probes 230, which may be of any suitable type and configuration such as needles or pins provided a suitable pitch spacing may be obtained to support 50 micron or less testing pad pitches in a preferred embodiment. Testing probes 230 each have a lower end configured and arranged for mating with a corresponding testing pad 252 on a DUT 250 to be tested. Preferably, testing probes 230 have a pitch $P_N$ that matches the pitch $P_T$ of test pads 252 on DUT 50. In one exemplary embodiment, pitches $P_T$ and $P_N$ may be about 50 microns.

With continuing reference to FIG. 2, in one possible embodiment, testing probes 230 may each have an upper portion 234 that is supported by and pass through intermediate probe support 232 within probe head 260. Preferably, probe support 232 is made of a non-conductive material such as polyamide mylar. Each upper portion 234 of probes 230 may terminate in an enlarged contact end 236 at the uppermost part for mating with corresponding contacts on space transformer 240. In some embodiment, probe head 260 may further include a lower substrate 226 through which testing probes 230 extend therethrough and are guided as shown in FIG. 2, an upper substrate 222 configured to receive the probe upper portions 234 and contact ends 236, and a spacer 224 interposed between the lower and upper substrates. Contact ends 236 preferably extend through upper substrate 222 to connect with contact pads on space transformer 240. It will be appreciated that other configurations of test probe 230 support structures may be provided and the invention is not limited to the configuration and/or features of probe head 260 described herein.

Space transformer 240 may be a multi-layered organic (MLO) or multi-layered ceramic (MLC) interconnect substrate 245 in some preferred embodiments. Space transformer 240 includes a C4 side 400 having a lower surface 241 with a fine pitch C4 contact test pad array 242 for engaging and mating with contact ends 236 of probe head 260, and an opposite BGA side 402 having an upper surface 243 with a ball grid array (BGA) for mating with corresponding contacts 211 on PCB 210. BGA array may have a pitch $P_B$ defined between the balls, which may be made of solder or other suitable materials.

A method for modifying an existing commercially-available testing probe card 200 according to principles of the present invention, to produce a space transformer 240 with a fine pitch C4 contact pad array, will now be described with reference to fabrication sequence shown FIGS. 3-14. These figures show space transformer 240 in an inverted position opposite from the normal operational position when installed in a testing machine as shown in FIGS. 2 and 15. The various photolithography, material deposition, and material removal processes described below refer to known processes typically used in MEMS or semiconductor fabrication unless otherwise noted.

Referring first to FIG. 3, a space transformer 240 is provided having an existing original C4 contact test pad array 410 formed on a substrate 245. Substrate 245 may be an MLO or MLC substrate in some embodiments. In one embodiment, the existing C4 pad array may have an initial pitch spacing of about 150 microns between the pads. The lower and upper surfaces 241, 243 are first ultrasonically cleaned to prepare the surfaces for receiving conductive materials.

In the next steps shown in FIG. 4, a metal conductor 300 such as copper in one embodiment is deposited by sputtering on the BGA side 402 and upper surface 243 of space transformer 240 to electrically short or connect each conductive channel 301 together. In some embodiments, conductor 300 may later be etched by conventional means to produce conductive paths with desired patterns. In addition, a metal conductor such as copper in one embodiment is deposited by plating on the C4 side 400 over the original C4 test pad array 410 to make the C4 test pads match the height of the space transformer substrate 245 on lower surface 241, as shown. This step builds up original grounding (GND) C4 test pads 303 and input/output (I/O) C4 test pads 304 as shown in FIG. 4.

Figure 5:
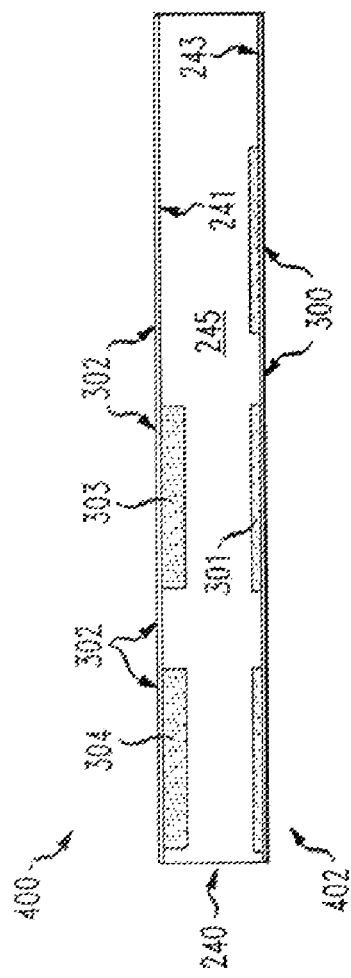
Figure 6:
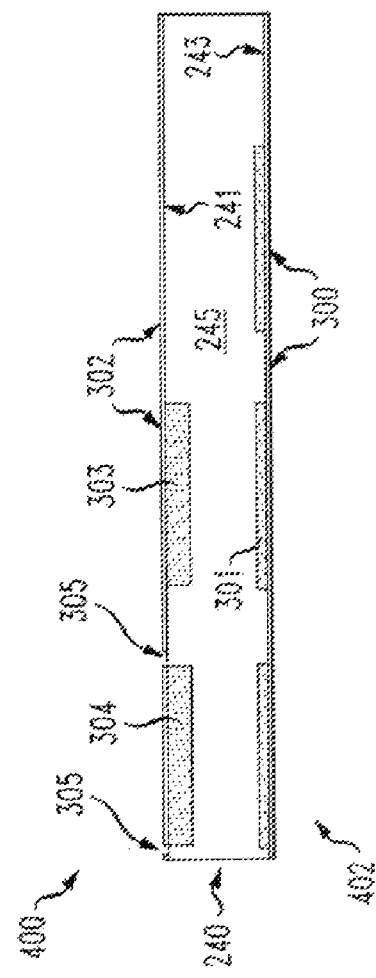

Referring to FIG. 5, in some embodiments, metal such as copper is deposited on lower surface 241 to form a GND plane 302 for impedance control for use in high frequency 50 ohm standard testing requirements such as used in known good die (KGD) testing. In FIG. 6, conventional photolithography and etching of GND plane 302 is performed to isolate the I/O C4 pads 304 as shown by creating gaps 305 around the I/O pads. The etching may be performed by any suitable conventional process used in MEMS or semiconductor fabrication, such as wet etching for example.

Referring to FIG. 7, a first dielectric layer 310 is coated or deposited on C4 or lower side 241 over GND plane 302 by any suitable conventional method used in MEMS or semiconductor fabrication. Dielectric layer 310 is preferably an electrically insulating material to isolate active components and leads formed in substrate 245. In preferred embodiments, first dielectric layer 310 may be polyamide photoresist or an epoxy-based photoresist such as SU-8 photoresist available from MicroChem Corporation of Newton, Mass.; however, other suitable photoresist materials may be used.

Referring to FIG. 8, the GND C4 pads 303 and I/O C4 pads 304 are next opened and exposed by conventional photolithography and associated photoresist material removal processes such as ashing to remove portions of first dielectric layer 310 lying above pads 303, 304. In addition, openings 311 are made in first dielectric layer 310 to expose portions of GND plane 302 for later forming new C4 GND contacts 350 (see, e.g. FIG. 14).

Figure 9:
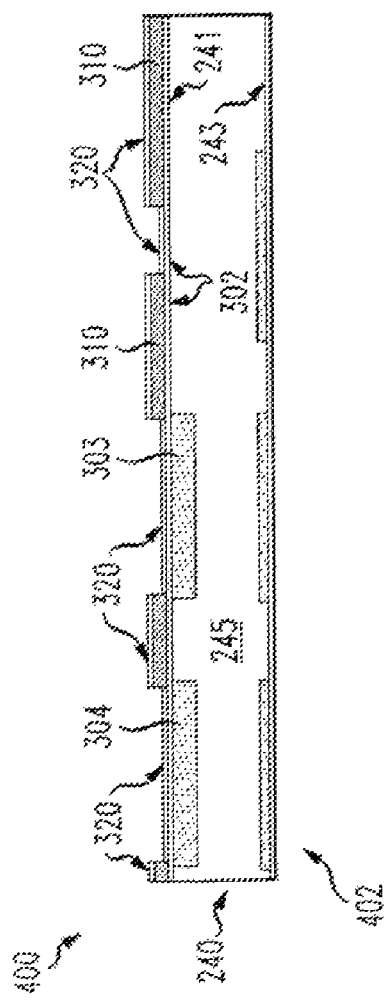

Referring to FIG. 9, a second conductive metal layer 320, such as copper preferably, is next deposited on C4 side 400 including metal GND plane 302 by sputtering or another suitable method. Metal layer 320 is used later in conjunction with the conductive metal deposition step described below in conjunction with FIG. 11.

Figure 10:
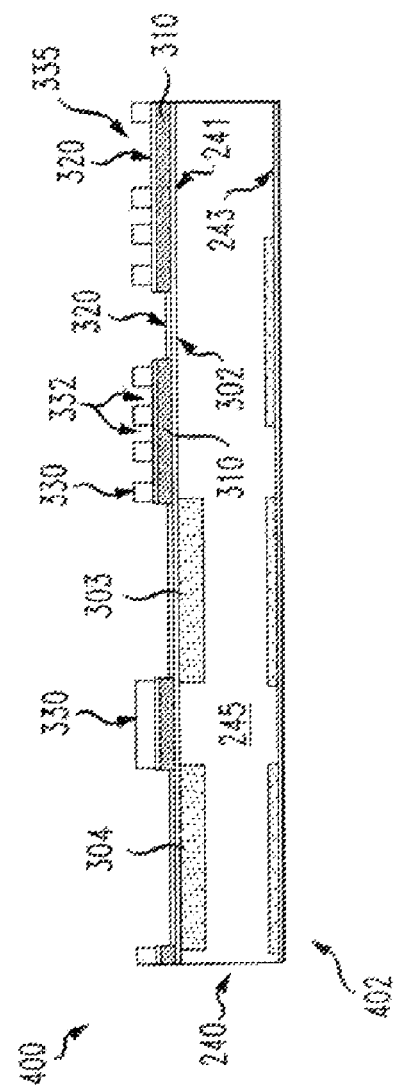

In FIG. 10, a photoresist 330 is coated on C4 side 400 and patterned by conventional semiconductor or MEMS techniques. The patterned photoresist creates a series of recesses 332 for later forming a redistribution layer (RDL) with conductive redistribution leads 334 (see FIG. 12) for rerouting electrical signals from the new finer pitch C4 contact test pad array 242 to be created and the original existing C4 test pads having a larger existing pitch. The photoresist patterning also maintains openings therein for I/O C4 pads 304, GND C4 pads 303, and new C4 GND contacts 350 (see, e.g. FIG. 14). In addition, new recesses 335 are created through the photoresist to expose second conductive metal layer 320 for later forming new C4 I/O contacts 352 (see, e.g. FIG. 14).

Figure 11:
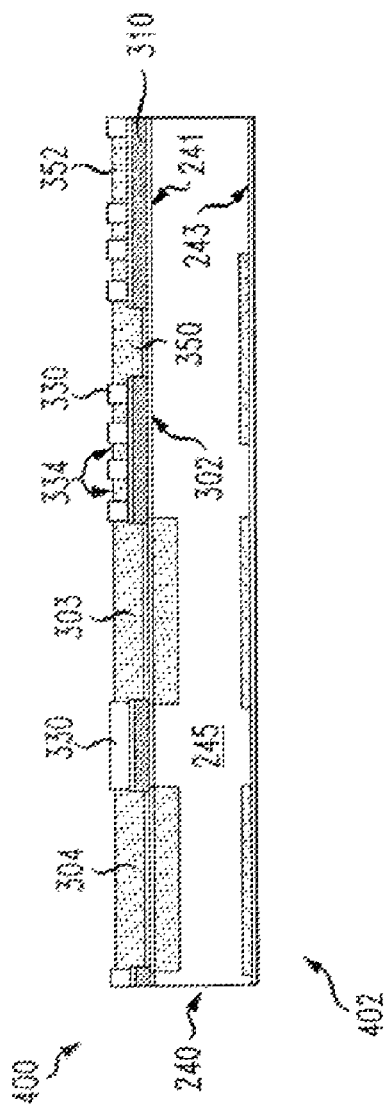

Referring now to FIG. 11, conductive metal such as copper in one embodiment is deposited by plating onto the C4 side 400 of substrate 245 which fills the open recesses 332 to form a RDL having a plurality of conductive redistribution leads 334. The redistribution leads 334 preferably are routed on the first dielectric layer 310 in one embodiment to couple the new contact test pad array 242 to the original contact test pad array 410 as best shown in top view FIG. 16 (the actual RDL connections to and between, for example I/O C4 pads 304 and GND C4 pads 303, and corresponding new C4 GND contacts 350 and C4 I/O contacts 352 are not shown in the cross-sectional figures for clarity). The metal deposition process in FIG. 11 also fills the recesses in the photoresist layer associated with the I/O C4 pads 304 and GND C4 pads 303, and new C4 GND contacts 350 and C4 I/O contacts 352. The copper I/O C4 pads 304 and GND C4 pads 303 are completed in this step. However, this step only creates copper bases for the new C4 GND contacts 350 and C4 I/O contacts 352, whose formation will be completed in subsequent steps.

Figure 12:
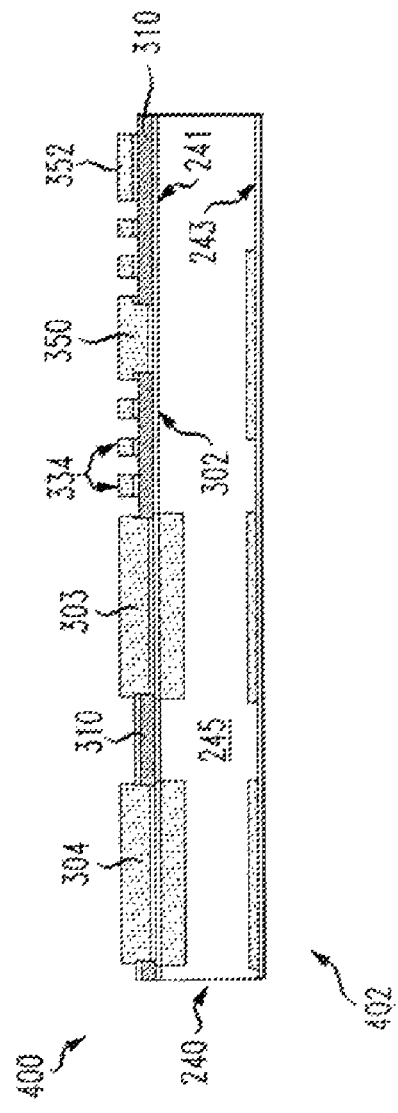

Referring to FIG. 12, the photoresist 330 is next removed leaving the I/O C4 pads 304, GND C4 pads 303, new C4 GND contacts 350, new C4 I/O contacts 352, and redistribution leads 334 as shown. Any conventional photoresist material removal process may be used, such as dry plasma gas ashing/etching or a liquid solvent (e.g., acetone, etc.). In addition to removing the photoresist, the etching is preferably continued after the photoresist has been removed to etch back and remove portions of the second metal layer 320 lying beneath the photoresist. This exposes the first dielectric layer 310 between the redistribution leads 334, and the I/O C4 pads 304 and GND C4 pads 303. Dielectric layer 310 preferably is selected to be of a material having electrical insulating properties to electrically isolate the redistribution leads 334 and new C4 I/O contacts 352 from GND plane 302 as shown. The only portions of metal layer 320 remaining after the etch back are those encapsulated between conductive GND plane 302 and the metal layer deposited in the step shown in FIG. 11 to form the new RDL redistribution leads 334.

Figure 13:
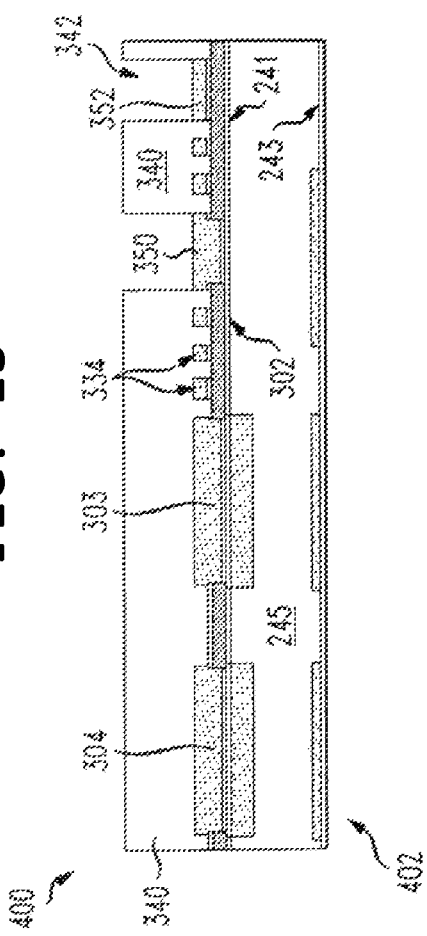

Referring now to FIG. 13, a passivation layer 340, which in some embodiments may preferably be formed of a dielectric material, is deposited or coated onto C4 array side 400 of substrate 245 as shown. Passivation layer 340 is preferably an electrically insulating material to isolate active components and leads formed in substrate 245. In one embodiment, layer 340 preferably may be made of a photoresist material, and more preferably an epoxy-based dielectric photoresist such as SU-8 photoresist available from MicroChem Corporation of Newton, Mass. Other suitable passivation materials and dielectrics may be used however. Photolithography is preferably then performed to pattern layer 340 and create recess openings 342 that expose new C4 GND contacts 350 and new C4 I/O contacts 352.

Figure 14:
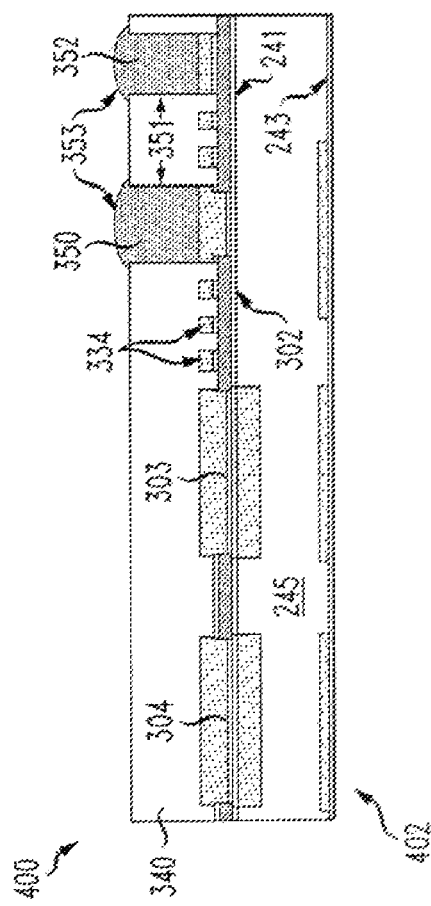
Figure 15:
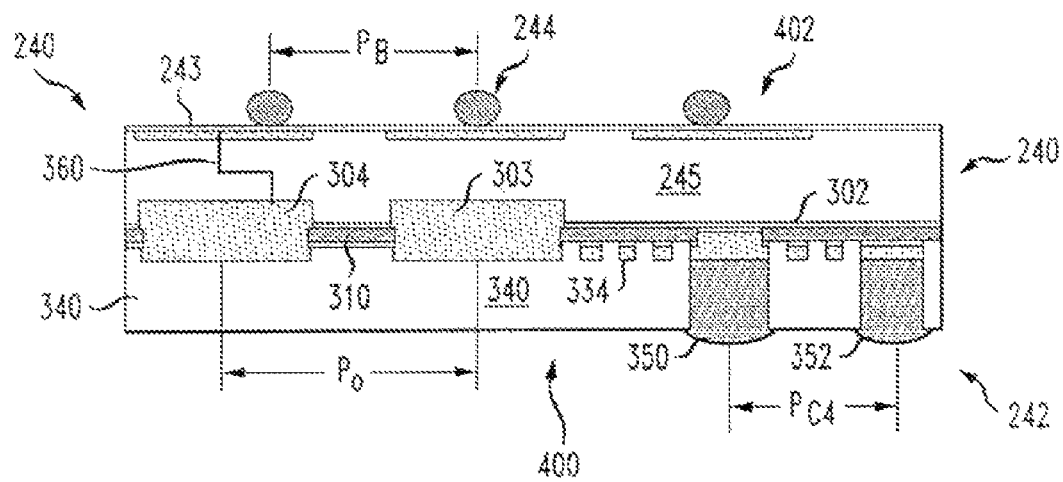
FIG. 15 is a partial cross-sectional detailed side view of the space transformer of FIG. 2.

Referring to FIG. 14, openings 342 are plated and filled with a conductive metal to form shafts 351 which build up the new C4 GND contacts 350 and new C4 I/O contacts 352 to at least the surface of second passivation layer 340, and in some embodiments preferably slightly above the surface. In one exemplary embodiment, the conductive metal used for shafts 351 may be NiCo (nickel cobalt) which has good hardness properties. The NiCo shafts 351 are plated on the copper bases previously built and described with reference to FIG. 11. In the preferred embodiment, gold is plated onto the top portions of shafts 351 forming top contact surfaces 353 of the C4 GND contacts 350 and C4 I/O contacts 352 to provide good conductivity and corrosion resistance properties. Tops surfaces 353 define a fine pitch C4 contact pad array 242 for engaging and mating with contact ends 236 of probe head 260. It will be appreciated that other suitable conductive metals and alloys may be used for shafts 351 and top surfaces 353. In addition, any other suitable conductive metals and alloys may be substituted for the exemplary materials indicated in any of the foregoing process steps.

The remanufactured and modified space transformer 240 is shown in FIG. 15. The spacing of C4 GND contacts 350 and C4 I/O contacts 352 define a fine pitch C4 contact pad array 242 for engaging and mating with contact ends 236 of test probe head 260. In contrast to the original C4 pad defined by I/O C4 pad 304 and GND C4 pad 303 having an original pitch of Po, the new C4 contact pad array 242 preferably has a pitch $P_{C4}$ that is less than pitch Po. In some embodiments, pitch $P_{C4}$ may be about 50 microns or less. The original pitch $P_B$ of BGA array 244 may be maintained on the opposite side 402 from the C4 array 242. In addition, all internal wiring or other conductive path tracings in substrate 245, such as represented by a single tracing 360 shown for clarity in FIG. 15, are maintained by the exemplary method described herein so that the pitch $P_B$ of BGA array 244 remains compatible with the spacing of contact pads 211 on PCB 210 (shown in FIG. 2). It will be noted that I/O C4 pads 304 and GND C4 pads 303 are embedded or encapsulated in substrate 245 by the second passivation layer 340 as shown in FIG. 15, and are electrically accessible by tracings 360 from BGA side 402 and redistribution leads 334 from the C4 side 400 via the new C4 contact pad array 242.

Figure 16:
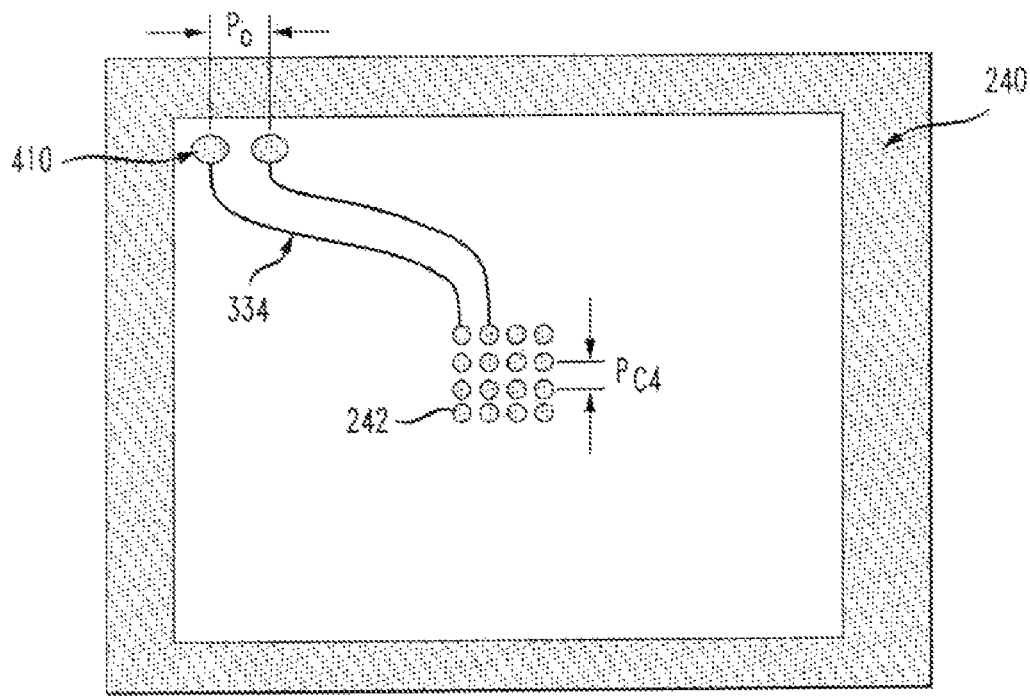
FIG. 16 is a top plan view of the space transformer of FIG. 15 with a top second passivation layer removed to show electrical contacts therebelow.

FIG. 16 shows a view down onto C4 side 400 of the modified space transformer 240 shown in FIG. 15. The second passivation layer 340 is removed from FIG. 16 to better show the pre-existing original C4 contact test pad array 410 contacts. As can be seen, the new C4 contact test pad array 242 in a preferred embodiment may have a smaller pitch $P_{C4}$ than the pitch Po of the original C4 contact test pad array 410. The new test pad array 242 is electrically connected to the original test pad array 410, including I/O C4 pads 304 and GND C4 pads 303, by the new RDL with redistribution leads 334 as shown.

In an alternative method and embodiment of a modified space transformer, the new RDL with redistribution leads 334 may be built directly onto space transformer substrate 245 without first forming a GND plane 302 as shown in FIG. 5 or first dielectric layer 310 as shown in FIG. 7. This also eliminates the need for the step shown in FIG. 6 of isolating I/O C4 pads 304 from GND plane 302. In this alternative embodiment, following the step shown in FIG. 4 described elsewhere herein, the step shown in FIG. 10 of coating and patterning photoresist 330 on C4 side 400 is then completed to create recesses 332 for forming the new RDL having a plurality of conductive redistribution leads 334 that electrically connect the original C4 test pad array 410 to the new fine pitch test pad array 242 shown in FIGS. 15 and 16. The steps shown in FIGS. 11-14 are then completed as described elsewhere herein. Redistribution leads 334 are thereby formed electrically connecting original I/O C4 pads 304 with new C4 I/O contacts 352 and original GND C4 pads 303 with new C4 GND contacts 350. The modified or remanufactured space transformer formed by this alternative method would appear essentially as shown in FIGS. 15 and 16, but without GND plane 302 and first dielectric layer 310.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the invention. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for remanufacturing a semiconductor test probe card space transformer to decrease pitch spacing of a controlled collapse chip connection (C4) contact test pad, the method comprising:
   providing a space transformer having a substrate and a plurality of first test contacts disposed on a first side of the substrate for performing Device Under Test (DUT) electrical tests, the first test contacts defining a first pitch spacing between the contacts, the first test contacts including first input/output pads and first ground pads;
   depositing a metal ground plane layer on the first side of the substrate;
   depositing a first dielectric layer on the ground plane layer;
   patterning the first dielectric layer to form recesses therein;
   filling at least some of the recesses with a conductive metal to form a plurality of redistribution leads; and
   forming a plurality of second test contacts defining a second pitch spacing between the contacts being smaller than the first pitch spacing, at least some of the second test contacts being connected to some of the first test contacts via the redistribution leads.

2. The method of claim 1, further comprising a step of encapsulating the first test contacts with a passivation layer.

3. The method of claim 2, wherein the passivation layer is a photoresist material.

4. The method of claim 1, wherein the first input/output pads are electrically isolated from the ground plane layer.

5. The method of claim 1, wherein the filling step includes simultaneously filling at least some of the recesses with the conductive metal to form conductive bases for the second test contacts.

6. The method of claim 1, further comprising a step of depositing a passivation layer over the first test contacts and redistribution leads.

7. The method of claim 6, further comprising a step of forming recesses in the passivation layer and depositing a conductive metal in the passivation layer recesses for forming the second test contacts.

8. The method of claim 1, wherein the transformer substrate includes a second side opposite the first side and defining conductive channels for a ball grid array.

9. The method of claim 8, further comprising a step of depositing a conductive metal layer on the second side.

10. A method for fabricating a semiconductor test probe card space transformer to decrease pitch spacing of a controlled collapse chip connection (a C4) contact test pad, the method comprising:
    providing a space transformer having a substrate and plurality of first a controlled collapse chip connection (C4)

contact test pads on one first side for performing Device Under Test (DUT) electrical tests, the first test pads defining a first pitch spacing between the test pads and being positioned to engage contacts on a Device Under Test (DUT);

depositing a first metal layer on the first side as a ground plane on the substrate;

depositing a first dielectric layer on the ground plane;

forming a plurality of second a controlled collapse chip connection (C4) test contacts on the first side, the second contacts defining a second pitch spacing between the contacts being different than the first pitch spacing; and forming a plurality of redistribution leads on the first dielectric layer to electrically couple the first contact test pads to the second contact test pads.

11. The method of claim 10, further comprising encapsulating the first contact test pads with a passivation layer.

12. The method of claim 11, wherein the passivation layer is made of a dielectric photoresist material.

13. The method of claim 10, further comprising a step of patterning the first dielectric layer to form recesses for subsequently forming the plurality of redistribution leads and second test contacts.

14. The method of claim 13, wherein the plurality of redistribution leads and second test contacts are formed by depositing a conductive metal in recesses.

15. The method of claim 10, wherein the redistribution leads and second test contacts are formed by depositing a second metal layer on the substrate.

16. The method of claim 10, wherein the second test contacts includes at least one input/output C4 contact isolated from the ground plane and at least one ground contact electrically coupled to the ground plane.

17. A method for fabricating a semiconductor test probe card space transformer to decrease pitch spacing of a controlled collapse chip connection (a C4) contact test pad, the method comprising:

providing a space transformer having a substrate and plurality of first a controlled collapse chip connection (C4) contact test pads on one first side for performing Device Under Test (DUT) electrical tests, the first test pads defining a first pitch spacing between the test pads and being positioned to engage contacts on a Device Under Test (DUT);

forming a plurality of second a controlled collapse chip connection (C4) test contacts on the first side of the substrate, the second contacts defining a second pitch spacing between the contacts being different than the first pitch spacing;

forming a plurality of redistribution leads to electrically couple the first contact test pads to the second contact test pads;

encapsulating the first and second contact test pads with a passivation layer; and forming conductive shafts through the passivation layer to extend the second contact test pads to an exposed surface of the passivation layer for making electrical contact with test card probes for wafer level testing of integrated circuit chips.

18. The method of claim 17, further comprising forming a ground plane.

* * * * *

UNITED STATES PATENT AND TRADEMARK OFFICE
CERTIFICATE OF CORRECTION

PATENT NO.         : 8,322,020 B2                                    Page 1 of 1
APPLICATION NO.    : 13/227580
DATED              : December 4, 2012
INVENTOR(S)        : Ming Cheng Hsu et al.

It is certified that error appears in the above-identified patent and that said Letters Patent is hereby corrected as shown below:

In the Claims:

Column 8, Line 21, Claim 1, insert -- , -- after "(C4)".

Column 8, Line 67, Claim 10, delete "a" after "first".

Column 10, Line 8, Claim 17, delete "a" after "first".

Column 10, Line 14, Claim 17, delete "a" after "second".

Signed and Sealed this
Eighth Day of April, 2014

Michelle K. Lee
*Deputy Director of the United States Patent and Trademark Office*